US012690244B2

(12) United States Patent
Qin et al.

(10) Patent No.: US 12,690,244 B2
(45) Date of Patent: Jul. 21, 2026

(54) DEEP BACKSIDE POWER RAIL CUT

(71) Applicant: INTERNATIONAL BUSINESS MACHINES CORPORATION, Armonk, NY (US)

(72) Inventors: Liqiao Qin, Albany, NY (US); Tao Li, Slingerlands, NY (US); Ruilong Xie, Niskayuna, NY (US); Jingyun Zhang, Albany, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 345 days.

(21) Appl. No.: 18/610,317

(22) Filed: Mar. 20, 2024

(65) Prior Publication Data

US 2025/0301726 A1 Sep. 25, 2025

(51) Int. Cl.

| | |
|---|---|
| *H10D 84/83* | (2025.01) |
| *H10D 30/01* | (2025.01) |
| *H10D 30/43* | (2025.01) |
| *H10D 30/67* | (2025.01) |
| *H10D 62/10* | (2025.01) |
| *H10D 62/13* | (2025.01) |
| *H10D 64/01* | (2025.01) |
| *H10D 84/01* | (2025.01) |
| *H10D 84/03* | (2025.01) |
| *H10D 84/85* | (2025.01) |
| *H10W 20/41* | (2026.01) |

(52) U.S. Cl.
CPC ......... *H10D 62/118* (2025.01); *H10D 30/014* (2025.01); *H10D 30/43* (2025.01); *H10D 30/6735* (2025.01); *H10D 30/6757* (2025.01);

*H10D 62/151* (2025.01); *H10D 64/017* (2025.01); *H10D 84/0135* (2025.01); *H10D 84/0149* (2025.01); *H10D 84/0188* (2025.01); *H10D 84/038* (2025.01); *H10D 84/83* (2025.01); *H10D 84/851* (2025.01); *H10W 20/427* (2026.01)

(58) Field of Classification Search
CPC ..... H10D 30/6735; H10D 30/501–509; H10D 30/019–0198; H10D 84/0188; H10D 84/0151; H10D 84/832; H10D 84/833; H10D 84/851; H10D 84/852
See application file for complete search history.

(56) References Cited

U.S. PATENT DOCUMENTS

| | | | | |
|---|---|---|---|---|
| 9,805,983 | B1 | 10/2017 | Cheng | |
| 2021/0407999 | A1* | 12/2021 | Huang | ................... H10D 30/43 |
| 2022/0238388 | A1 | 7/2022 | Hiblot | |
| 2022/0392896 | A1 | 12/2022 | Guler | |
| 2023/0047194 | A1 | 2/2023 | Chen | |
| 2023/0067354 | A1 | 3/2023 | Wei | |
| 2023/0139929 | A1 | 5/2023 | Xie | |
| 2023/0197569 | A1 | 6/2023 | Dewey | |
| 2023/0207553 | A1 | 6/2023 | Xie | |
| 2024/0072050 | A1* | 2/2024 | Li | ........................ H10D 30/014 |
| 2024/0079451 | A1* | 3/2024 | Lin | ...................... H10D 62/151 |
| 2024/0105786 | A1* | 3/2024 | Liang | ................... H10D 62/021 |
| 2025/0212503 | A1* | 6/2025 | Moon | ................. H10D 62/116 |

* cited by examiner

*Primary Examiner* — Yu Chen

(74) *Attorney, Agent, or Firm* — L. Jeffrey Kelly

(57) ABSTRACT

A nanosheet semiconductor structure including a backside cut dielectric physically separating an NFET source drain region from a PFET source drain region, where a first portion of the backside cut dielectric contacts a source drain contact and a second portion of the backside cut dielectric contacts a gate.

20 Claims, 12 Drawing Sheets

SECTION X-X

SECTION Y₁-Y₁

SECTION Y₂-Y₂

SECTION Y₁-Y₁

SECTION X-X

SECTION Y₂-Y₂

SECTION Y₁-Y₁

SECTION X-X

100

138  136  142  108  106  106  106

*SECTION Y₂-Y₂*

Z  Y 138  136  140  132  140  120  116  124  122

*SECTION Y₁-Y₁*

Z  Y 138  136  132  108  104  128  126  120  118  116  140

*SECTION X-X*

Z  X

SECTION Y₂-Y₂

SECTION Y₁-Y₁

SECTION X-X

SECTION Y₂-Y₂

SECTION Y₁-Y₁

SECTION X-X

SECTION Y₂-Y₂

SECTION Y₁-Y₁

SECTION X-X

SECTION Y₂-Y₂

SECTION Y₁-Y₁

SECTION X-X

SECTION $Y_2$-$Y_2$

SECTION $Y_1$-$Y_1$

SECTION X-X

100

SECTION Y₂-Y₂

SECTION Y₁-Y₁

SECTION X-X

SECTION Y₂-Y₂

SECTION Y₁-Y₁

SECTION X-X

DEEP BACKSIDE POWER RAIL CUT

BACKGROUND

The present invention generally relates to semiconductor structures, and more particularly to nanosheet transistor structures having a deep backside power rail cut.

Complementary Metal-oxide-semiconductor (CMOS) technology is commonly used for field effect transistors (hereinafter "FET") as part of advanced integrated circuits (hereinafter "IC"), such as central processing units (hereinafter "CPUs"), memory, storage devices, and the like. As demands to reduce the dimensions of transistor devices continue, nanosheet FETs help achieve a reduced FET device footprint while maintaining FET device performance. A nanosheet FET includes a plurality of stacked nanosheets extending between a pair of source drain epitaxial regions. The device may be a gate-all-around device or transistor in which the gate surrounds a portion of the nanosheet channel. A nanosheet device contains one or more layers of semiconductor channel material portions having a vertical thickness that is substantially less than its width.

SUMMARY

According to an embodiment of the present invention, a semiconductor structure is provided. The semiconductor structure may include a backside cut dielectric physically separating two adjacent backside power rails, where a first portion of the backside cut dielectric contacts a source drain contact and a second portion of the backside cut dielectric contacts a gate.

According to another embodiment of the present invention, a semiconductor structure is provided. The semiconductor structure may include a backside cut dielectric physically separating an NFET source drain region from a PFET source drain region, where a first portion of the backside cut dielectric contacts a source drain contact and a second portion of the backside cut dielectric contacts a gate.

According to another embodiment of the present invention, a semiconductor structure is provided. The semiconductor structure may include a backside cut dielectric physically separating an NFET source drain region from a PFET source drain region, where a first portion of the backside cut dielectric contacts a source drain contact and a second portion of the backside cut dielectric contacts a gate.

BRIEF DESCRIPTION OF THE DRAWINGS

The following detailed description, given by way of example and not intended to limit the invention solely thereto, will best be appreciated in conjunction with the accompanying drawings, in which.

Figure 1:
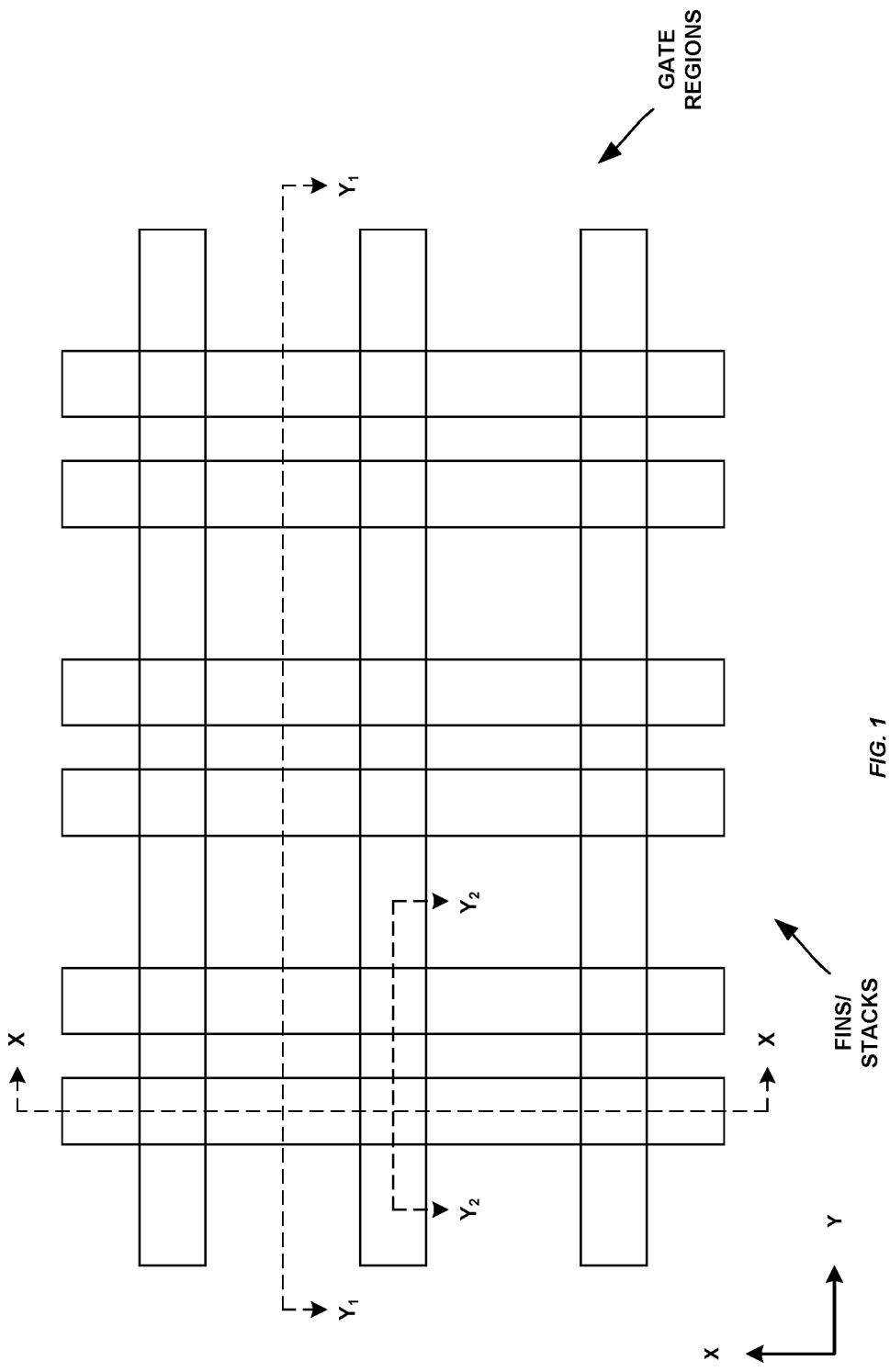
FIG. 1, a top view of a generic structure is shown to provide spatial context to the different cross-sectional views and structural orientations of the semiconductor structures shown in the subsequent figures.

The drawings are not necessarily to scale. The drawings are merely schematic representations, not intended to portray specific parameters of the invention. For clarity and ease of illustration, scale of elements may be exaggerated. The drawings are intended to depict only typical embodiments of the invention. In the drawings, like numbering represents like elements.

DETAILED DESCRIPTION

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper", "lower", "right", "left", "vertical", "horizontal", "top", "bottom", and derivatives thereof shall relate to the disclosed structures and methods, as oriented in the drawing figures. It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Also, the term "sub-lithographic" may refer to a dimension or size less than current dimensions achievable by photolithographic processes, and the term "lithographic" may refer to a dimension or size equal to or greater than current dimensions achievable by photolithographic processes. The sub-lithographic and lithographic dimensions may be determined by a person of ordinary skill in the art at the time the application is filed.

The terms substantially, substantially similar, about, or any other term denoting functionally equivalent similarities refer to instances in which the difference in length, height, or orientation convey no practical difference between the definite recitation (e.g. the phrase sans the substantially similar term), and the substantially similar variations. In one embodiment, substantial (and its derivatives) denote a difference by a generally accepted engineering or manufacturing tolerance for similar devices, up to, for example, 10% deviation in value or 10° deviation in angle.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on the distinctive features or elements of various embodiments of the present invention.

As semiconductor devices continue to decrease in size, it has become desirable to provide relatively small distances between the near-most nFET and pFET active regions (i.e., the "N2P space") on the order of about 8 nanometers (nm) to about 10 nm. Providing N2P spaces at these dimensions can present challenges to communicating with the pFET section and the nFET section. Specifically, N2P spaces on this order reduce the process window within which contact structures connecting the nFET section and pFET section could electrically short with one another. Although the process window can be broadened by positioning the contact structures at locations laterally offset from the N2P space, doing so increases the electrical resistance between the contact structures and the respective pFET section and nFET section, thereby offsetting any improvement in process window and/or electrical characteristics of the multilayer IC device. In many structures, the N2P space will divide or separate N-type devices from P-type devices.

Complementary field effect transistors, including gate-all-around transistor devices and nanosheet transistor devices, have known advantages over conventional transistor structures in terms of density, performance, power consumption, and integration. However, fabricating device contacts on a backside of the wafer presents unique challenges. More specifically, for example, conventional backside contact and placeholder fabrication techniques result in reduced backside contact size due to placeholder trimming during substrate removal.

The present invention generally relates to semiconductor structures, and more particularly to nanosheet transistor structures having a deep backside power rail cut. More specifically, the nanosheet transistor structures and associated method disclosed herein enable a novel solution for providing nanosheet transistor structures having a deep backside power rail cut. Exemplary embodiments of nanosheet transistor structures having a deep backside power rail cut are described in detail below by referring to the accompanying drawings in FIGS. 1 to 32. Those skilled in the art will readily appreciate that the detailed description given herein with respect to these figures is for explanatory purposes as the invention extends beyond these limited embodiments.

Referring now to FIG. 1, a top view of a generic structure is shown to provide spatial context to the different cross-sectional views and structural orientations of the semiconductor structures shown in the figures and described below. Additionally, XYZ Cartesian coordinates may be also shown in each of the drawings to provide additional spatial context. The terms "vertical" or "vertical direction" or "vertical height" as used herein denote a Z-direction of the Cartesian coordinates shown in the drawings, and the terms "horizontal," or "horizontal direction," or "lateral direction" as used herein denote an X-direction and/or a Y-direction of the Cartesian coordinates shown in the drawings.

The generic structure illustrated in FIG. 1 shows multiple fins/stacks and multiple gate regions situated perpendicular to one another. FIGS. 1-32 represent cross section views oriented as indicated in FIG. 1.

Figures 2, 3, 4:
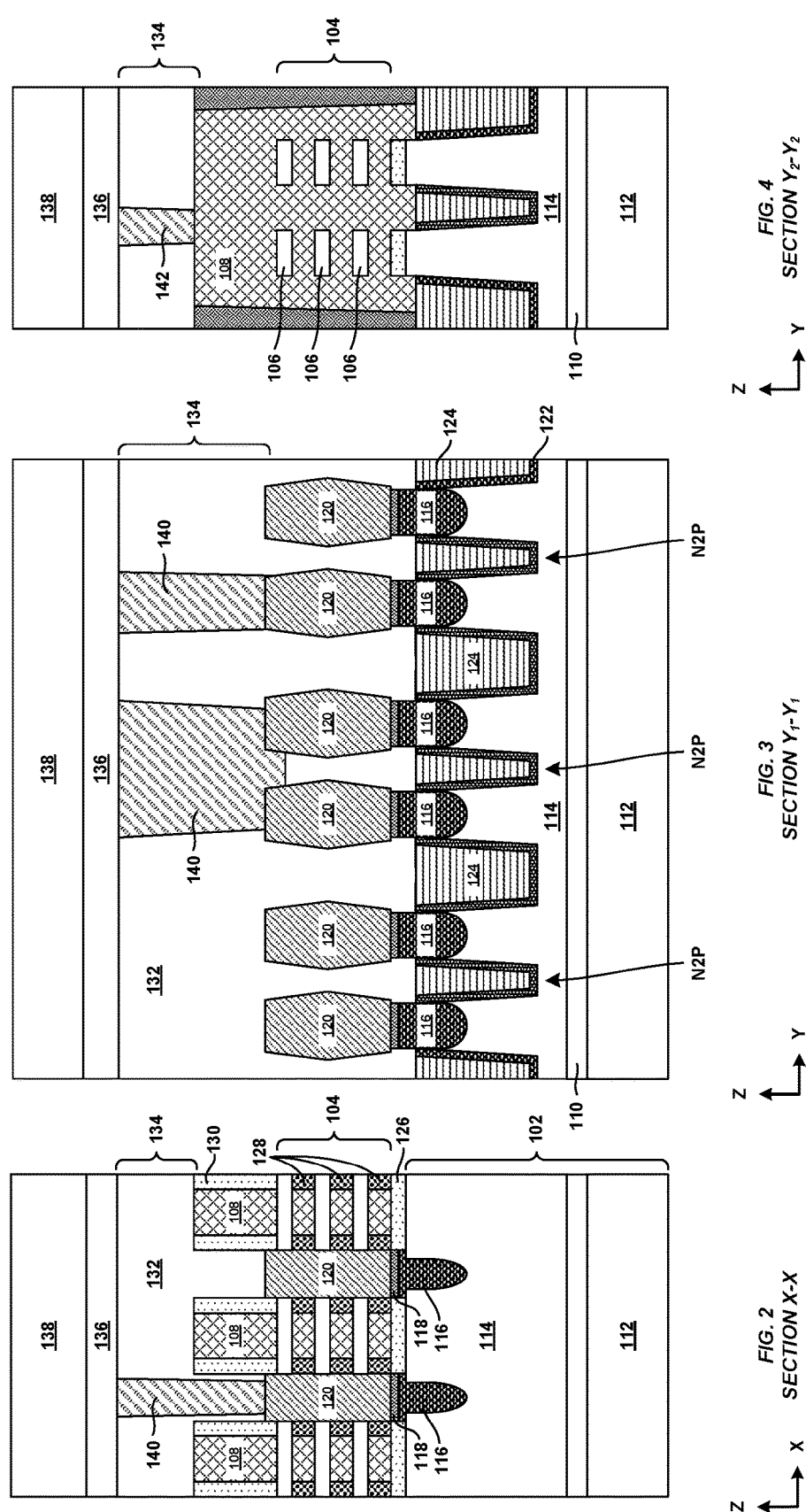
FIGS. 2, 3, and 4 are cross-sectional views of the semiconductor structure during an intermediate step of a method of fabricating nanosheet transistor structures according to an exemplary embodiment.

Referring now to FIGS. 2, 3, and 4, a structure 100 is shown during an intermediate step of a method of fabricating a nanosheet transistor structure according to an embodiment of the invention. FIG. 2 depicts a cross-sectional view of the structure 100 shown in FIG. 3 taken along line X-X, FIG. 3 depicts a cross-sectional view of the structure 100 shown in FIG. 2 taken along line $Y_1$-$Y_1$, and FIG. 4 depicts a cross-sectional view of the structure 100 taken along line $Y_2$-$Y_2$.

The structure 100 illustrated in FIGS. 2-4 includes an array of nanosheet transistors formed on a substrate 102 in accordance with known techniques. As illustrated, the array of nanosheet transistors includes nanosheet stacks 104. Each nanosheet stack 104 includes a plurality of silicon channels 106 surrounded by a single gate 108. For purposes of orientation, the substrate 102 is herein referred to as being on a "backside" of the structure 100 and the array of nanosheet transistors are herein referred to as being on a "frontside" of the structure 100. Further, certain features may be described herein as having a relative position with respect to the frontside or backside of the structure 100.

The substrate 102 may be a layered semiconductor such as a silicon-on-insulator or SiGe-on-insulator, where an etch stop layer 110 separates a base substrate 112 from a top semiconductor layer 114. Unlike conventional layered semiconductor substrates, the etch stop layer 110 of the substrate 102 may include any material which affects the desired etch selectivity during subsequent processing. For example, the etch stop layer 110 may be a conventional buried oxide layer, or it may be a silicon germanium layer with a specific germanium concentration. In practice, the etch stop layer 110 will function as an etch stop layer and can be composed of any material which supports that function.

In the present embodiment, both the base substrate 112 and the top semiconductor layer 114 may be any bulk substrate made from any of several known semiconductor materials such as, for example, silicon, germanium, silicon-germanium alloy, and compound (e.g. III-V and II-VI) semiconductor materials. For example, both the base substrate 112 and the top semiconductor layer 114 may be made from silicon.

The structure 100 further includes placeholders 116, buffer layers 118, and source drain regions 120 generally arranged between adjacent nanosheet stacks 104, as illustrated.

The placeholders 116 are formed by filling self-aligned openings in the top semiconductor layer 114 between adjacent nanosheet stacks 104 with a sacrificial material according to known techniques. Specifically, after filling, the sacrificial material is recessed to create the placeholders 116 according to known techniques. In an embodiment, the sacrificial material is silicon germanium or amorphous silicon epitaxially grown from the surfaces of the top semiconductor layer 114. In another embodiment, the sacrificial material is SiC, SiOC deposited using, for example, chemical vapor deposition (CVD) or plasma enhanced CVD (PECVD) and subsequently recessed using, for example, reactive ion etching (RIE). Other suitable deposition and recessing techniques may be used provided they do not induce a physical or chemical change to the silicon channels 106.

The buffer layers 118 are formed on top of the placeholders 116 according to known techniques. Specifically, an etch stop material is formed directly on top of the placeholders 116. In an embodiment, the etch stop material can be any silicon-based material suitable to provide needed etch stop properties during backside processing. For example, the buffer layers 118 are designed to allow the subsequent removal of the placeholders 116 selective to the source drain regions 120.

The source drain regions 120 are formed on top of the buffer layer 118 according to known techniques. Specifically, the source drain regions 120 are disposed between adjacent nanosheet stacks 104 in direct contact with exposed ends of the silicon channels 106. More specifically, the source drain regions 120 are formed using an epitaxial layer growth process on the exposed ends of the silicon channels 106 according to known techniques. Typically, in-situ doping is used to dope the source drain regions 120, thereby creating the necessary junctions of the semiconductor device.

Virtually all semiconductor transistors are based on the formation of junctions. Junctions are capable of both blocking current and allowing it to flow, depending on an applied bias. Junctions are typically formed by placing two semiconductor regions with opposite polarities into contact with one another. The most common junction is the p-n junction, which consists of a contact between a P-type piece of silicon, rich in holes, and an N-type piece of silicon, rich in electrons. N-type and P-type devices are formed by using different types of dopants to select regions of the device to form the necessary junction(s). For example, N-type devices can be formed by doping with arsenic (As) or phosphorous (P), and p-type devices can be formed by doping with implanting boron (B).

According to embodiments of the present invention, at least some of the source drain regions 120 are of a first-type, for example, P-type, and at least some of the source drain regions 120 are of a second-type, for example, N-type. Furthermore, in some embodiments, the source drain regions

120 which are separated by a relatively small N2P space are of different types. As best illustrated in FIG. 3, the cross-sectional view shows three N2P spaces having relatively small dimensions. For purposes of the present disclosure, a relatively small N2P space is approximately less than 10 nm. Despite the N2P nomenclature, and the embodiments described above, adjacent source drain regions 120 with relatively small N2P spacing may both of the same type, for example, both N-type or both P-type.

The structure 100 further includes shallow trench isolation regions (hereinafter "STI regions") which extend partially into the substrate 102 below the array of nanosheet transistors. In general, the STI regions may each include an isolation liner 122 and an isolation fill 124. For example, the isolation liner 122 is SiN, SiON, or SiOCN, and the isolation fill 124 is silicon oxide (SiO) or silicon nitride (SiN).

The structure 100 further includes stack spacers 126, inner spacers 128, and gate spacers 130.

The stack spacers 126 are disposed directly beneath the nanosheet stacks 104 separating them from the substrate 102. Specifically, for example, a relatively thin layer of silicon nitride is conformally deposited prior to forming the nanosheet stacks 104. In some embodiments, for example, the stack spacers 126 may be composed of SiN, SiBCN, SiOCN, SiOC, or any other combination of low-k materials. Like the buffer layers 118, the stack spacers 126 can provide etch selectivity during backside processing.

As used herein, "conformal" it is meant that a material layer has a continuous thickness, or substantially continuous thickness. For example, a continuous thickness generally means a first thickness as measured from a bottom surface to a topmost surface that is the same as a second thickness as measured from an inner sidewall surface to an outer sidewall surface.

The inner spacers 128 are disposed between alternate channels (106), and laterally separate the gates 108 from the source drain regions 120, as illustrated. The inner spacers 128 provide necessary electrical insulation between the gates 108 and the source drain regions 120.

The gate spacers 130 are added to define the channel length and the source drain regions, and ultimately electrically insulate the gates 108 from subsequently formed structures, such as, for example, source drain contact structures. The gate spacers 130 are critical for electrically insulating the gates 108 from the source drain regions 120 or subsequently formed contact structures. In at least one embodiment, the gate spacers 130 include silicon nitride, silicon boron nitride, silicon carbon nitride, silicon boron carbon nitride, or other known equivalents.

Finally, the structure 100 further includes a dielectric layer 132 directly above and surrounding the source drain regions 120. The dielectric layer 132 is composed of any suitable interlayer dielectric material, such as, for example, oxides such as silicon oxide ($SiO_x$), nitrides such as silicon nitride ($Si_xN_y$), and/or low-K materials such as SiCOH or SiBCN. In another embodiment, is composed of silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. In yet another embodiment, a self-planarizing material such as a spin-on glass (SOG) or a spin-on low-k dielectric material such as SiLK™ can be used to form the dielectric layer 132. Using a self-planarizing dielectric material as the dielectric layer 132 can avoid the need to perform a subsequent planarizing step. After formation, top surfaces of the dielectric layer 132 are typically made flush, or substantially flush, with top surfaces of the gates 108 and the gate spacers 130 by chemical mechanical polishing techniques.

The structure 100 further includes a middle-of-line 134, a back-end-of-line 136, a carrier wafer 138.

The middle-of-line 134 includes source drain contacts 140 and gate contacts 142 which may be generally referred to as middle-of-line contacts. The source drain contacts 140 and the gate contacts 142 are formed according to known techniques. The back-end-of-line 136 may include vias and metal lines which may be generally referred to as back-end-of-line interconnects. The vias and the metal lines are formed according to known techniques. Finally, the wafer 138 is secured to a top of the structure 100 according to an embodiment of the invention. The carrier wafer 138 is attached, or removably secured, to the back-end-of-line 136. In general, and not depicted, the carrier wafer 138 may be thicker than the other layers. Temporarily bonding the structure 100 to a thicker carrier provides improved handling and additional support for backside processing of thin wafers. After backside processing described below, the structure 100 may be de-bonded, or removed, from the carrier wafer 138 according to known techniques.

Although only a limited number of components, devices, or structures are shown, embodiments of the present invention shall not be limited by any quantity otherwise illustrated or discussed herein.

Figures 5, 6, 7:
FIGS. 5, 6, and 7 are cross-sectional views of the semiconductor structure after flipping the assembly and recessing the substrate according to an exemplary embodiment.

Referring now to FIGS. 5, 6, and 7, the structure 100 is shown after flipping the assembly and recessing the substrate 102 according to an embodiment of the invention. FIG. 5 depicts a cross-sectional view of the structure 100 shown in FIG. 6 taken along line X-X, FIG. 6 depicts a cross-sectional view of the structure 100 shown in FIG. 5 taken along line $Y_1$-$Y_1$, and FIG. 7 depicts a cross-sectional view of the structure 100 taken along line $Y_2$-$Y_2$.

First, the structure 100 is flipped 180 degrees to prepare for backside processing. In general, backside processing includes fabrication or processing of the structure 100 opposite the active device and wiring layers. Next, the substrate 102 is recessed according to known techniques. Specifically, the base substrate 112 is recessed or completely removed to expose the etch stop layer 110, as shown. It is noted, the orientation of the cross-sectional views referenced and illustrated hereafter will remain unchanged despite the actualities of flipping of the structure 100 for purposes of fabrication. As such, all references to "upper", "lower", "right", "left", "vertical", "horizontal", "top", "bottom", and derivatives thereof shall continue to relate to the disclosed structures and methods, as oriented in the drawing figures.

Figures 8, 9, 10:
FIGS. 8, 9, and 10 are cross-sectional views of the semiconductor structure after removing and recessing remaining portions of the substrate and trimming the placeholders according to an exemplary embodiment.

Referring now to FIGS. 8, 9, and 10, the structure 100 is shown after removing and recessing remaining portions of the substrate 102 and trimming the placeholders 116 according to an embodiment of the invention. FIG. 8 depicts a cross-sectional view of the structure 100 shown in FIG. 9 taken along line X-X, FIG. 9 depicts a cross-sectional view of the structure 100 shown in FIG. 8 taken along line $Y_1$-$Y_1$, and FIG. 10 depicts a cross-sectional view of the structure 100 taken along line $Y_2$-$Y_2$.

First, the etch stop layer 110 and the top semiconductor layer 114 are removed according to known techniques. Specifically, the etch stop layer 110 is removed selective to the top semiconductor layer 114, and the top semiconductor layer 114 is removed selective to the placeholders 116, the stack spacers 126, the gates 108, and the STI regions, as illustrated. As indicated in the figures, some erosion of the placeholders 116 is anticipated to be an unintended consequence resulting from selectively removing the top semiconductor layer 114. Such erosion would normally lead to smaller backside contacts using conventional fabrication techniques. For example, when the placeholders 116 are removed and replaced with the contact material, the resulting backside contact will mimic the eroded shape and size of the placeholders 116 which causes undesirable increases in resistance.

Figures 11, 12, 13:
FIGS. 11, 12, and 13 are cross-sectional views of the semiconductor structure after forming a backside dielectric layer according to an exemplary embodiment.

Referring now to FIGS. 11, 12, and 13, the structure 100 is shown after forming a backside dielectric layer 144 according to an embodiment of the invention. FIG. 11 depicts a cross-sectional view of the structure 100 shown in FIG. 12 taken along line X-X, FIG. 12 depicts a cross-sectional view of the structure 100 shown in FIG. 11 taken along line $Y_1$-$Y_1$, and FIG. 13 depicts a cross-sectional view of the structure 100 taken along line $Y_2$-$Y_2$.

The backside dielectric layer 144 is deposited according to known techniques.

Specifically, a backside dielectric material is blanket deposited across the structure 100. The backside dielectric layer 144 completely covers exposed portions of the placeholders 116, the stack spacers 126, and the STI regions, as illustrated. After deposition, known chemical mechanical polishing may be used to remove excess portions of the backside dielectric material from bottom surfaces of the structure 100.

Figures 14, 15, 16:
FIGS. 14, 15, and 16 are cross-sectional views of the semiconductor structure after forming a first mask and removing portions of the backside dielectric layer to form backside contact trenches according to an exemplary embodiment.

Referring now to FIGS. 14, 15, and 16, the structure 100 is shown after forming a first mask 146 and removing portions of the backside dielectric layer 144 to form backside contact trenches 148 according to an embodiment of the invention. FIG. 14 depicts a cross-sectional view of the structure 100 shown in FIG. 15 taken along line X-X, FIG. 15 depicts a cross-sectional view of the structure 100 shown in FIG. 14 taken along line $Y_1$-$Y_1$, and FIG. 16 depicts a cross-sectional view of the structure 100 taken along line $Y_2$-$Y_2$.

First, the first mask 146 is deposited and subsequently patterned to expose certain portions of the structure 100 according to known techniques. The first mask 146 can be an organic planarization layer (OPL) or a layer of material that is capable of being planarized or etched by known techniques. In an embodiment, for example, the first mask 146 can be an amorphous carbon layer able to withstand subsequent processing temperatures. The first mask 146 can preferably have a thickness sufficient to cover existing structures. After depositing the first mask 146, a dry etching technique is applied to pattern or recess the first mask 146 according to known techniques. The first mask 146 is patterned consistent with a size and a location of subsequently formed backside contact structures. For example, after patterning the first mask 146, portions of the structure 100 in contact regions are exposed, as illustrated. Specific to the embodiments disclosed herein, the first mask 146 is patterned selective to the backside dielectric layer 144.

Exposed portions of the backside dielectric layer 144 are then selectively removed to form the backside contact trenches 148 according to known techniques. Specifically, exposed portions of the backside dielectric layer 144 are removed using known etching techniques suitable to remove silicon-based dielectric materials selective to the first mask 146 and the placeholder 116, as illustrated. In an embodiment, the exposed portions of the backside dielectric layer 144 are removed using an anisotropic etch such as, for example, reactive ion etching. After removing the exposed portions of the backside dielectric layer 144, portions of the placeholders 116 are exposed, as illustrated. Significant to the embodiments disclosed herein, etching must continue until at least a portion of the placeholders 116 are exposed.

In such cases, some or all of the backside dielectric layer 144 is completely removed from between adjacent STI regions, as best illustrated in FIG. 15.

Figures 17, 18, 19:
FIGS. 17, 18, and 19 are cross-sectional views of the semiconductor structure after removing the placeholders according to an exemplary embodiment.

Referring now to FIGS. 17, 18, and 19, the structure 100 is shown after removing the placeholders 116 according to an embodiment of the invention. FIG. 17 depicts a cross-sectional view of the structure 100 shown in FIG. 18 taken along line X-X, FIG. 18 depicts a cross-sectional view of the structure 100 shown in FIG. 17 taken along line $Y_1$-$Y_1$, and FIG. 19 depicts a cross-sectional view of the structure 100 taken along line $Y_2$-$Y_2$.

The placeholders 116 exposed within the backside contact trenches 148 are selectively removed according to known techniques. Specifically, placeholders 116 are etched or removed selective to the backside dielectric layer 144, the stack spacers 126, the STI regions, and the buffer layer 118. The placeholders 116 can be removed using compatible selective dry etching techniques.

In doing so, the backside contact trenches 148 are enlarged directly beneath the source drain regions 120 without exposing the source drain regions 120 due to the existence of the buffer layers 118. Finally, exposed buffer layers 118 are subsequently removed selective to the surrounding structures according to known techniques. In some cases, some gouging or recessing of the source drain regions 120 may occur, as illustrated.

Figures 20, 21, 22:
FIGS. 20, 21, and 22 are cross-sectional views of the semiconductor structure after forming backside contact structures according to an exemplary embodiment.

Referring now to FIGS. 20, 21, and 22, the structure 100 is shown after forming backside contact structures 150 according to an embodiment of the invention. FIG. 20 depicts a cross-sectional view of the structure 100 shown in FIG. 21 taken along line X-X, FIG. 21 depicts a cross-sectional view of the structure 100 shown in FIG. 20 taken along line $Y_1$-$Y_1$, and FIG. 22 depicts a cross-sectional view of the structure 100 taken along line $Y_2$-$Y_2$.

The backside contact trenches 148 are filled with a conductive material to form the backside contact structures 150 according to known techniques. The backside contact structures 150 may include any suitable conductive material, such as, for example, copper, ruthenium, aluminum, tungsten, cobalt, or alloys thereof. In some embodiments, a metal silicide is formed at the bottom of the backside contact trenches prior to filling them with the conductive material.

After deposition, excess conductive material can be polished using known techniques until bottommost surfaces of the backside contact structures 150 are flush, or substantially flush, with bottommost surfaces of the backside dielectric layer 144, as illustrated. After polishing, bottommost surfaces of the backside contact structures 150 are substantially flat. It is noted, the backside contact structures 150 may include, for example, backside source drain contacts, as illustrated, as well as backside gate contacts (not shown).

Figures 23, 24, 25:
FIGS. 23, 24, and 25 are cross-sectional views of the semiconductor structure after forming a backside metallization layer and a second mask according to an exemplary embodiment.

Referring now to FIGS. 23, 24, and 25, the structure 100 is shown after forming a backside metallization layer 152 and a second mask 154 according to an embodiment of the invention. FIG. 23 depicts a cross-sectional view of the structure 100 shown in FIG. 24 taken along line X-X, FIG. 24 depicts a cross-sectional view of the structure 100 shown in FIG. 23 taken along line $Y_1$-$Y_1$, and FIG. 25 depicts a cross-sectional view of the structure 100 taken along line $Y_2$-$Y_2$.

First, the backside metallization layer 152 is deposited directly on the backside dielectric layer 144 according to known techniques. Specifically, a constructive interconnect material is blanket deposited across the structure 100. In all cases, the backside metallization layer 152 directly contacts exposed surfaces of the backside contact structures 150, as illustrated.

Next, the second mask 154 is deposited and subsequently patterned to expose certain backside portions of the structure 100 according to known techniques. Specifically, a hard mask material is blanket deposited on the backside metallization layer 152. In an embodiment, for example, the second mask 154 can be a silicon nitride layer or other compatible hard mask material. The second mask 154 can preferably have a thickness sufficient to cover existing structures. After depositing the second mask 154, a dry etching technique is applied to pattern or recess the second mask 154 according to known techniques. The second mask 154 is patterned consistent with a size and a location of subsequently formed backside power rail cut structures. For example, after patterning the second mask 154, portions of the structure 100 in cut regions are exposed, as illustrated. Specific to the embodiments disclosed herein, the second mask 154 is patterned selective to the backside metallization layer 152.

Figures 26, 27, 28:
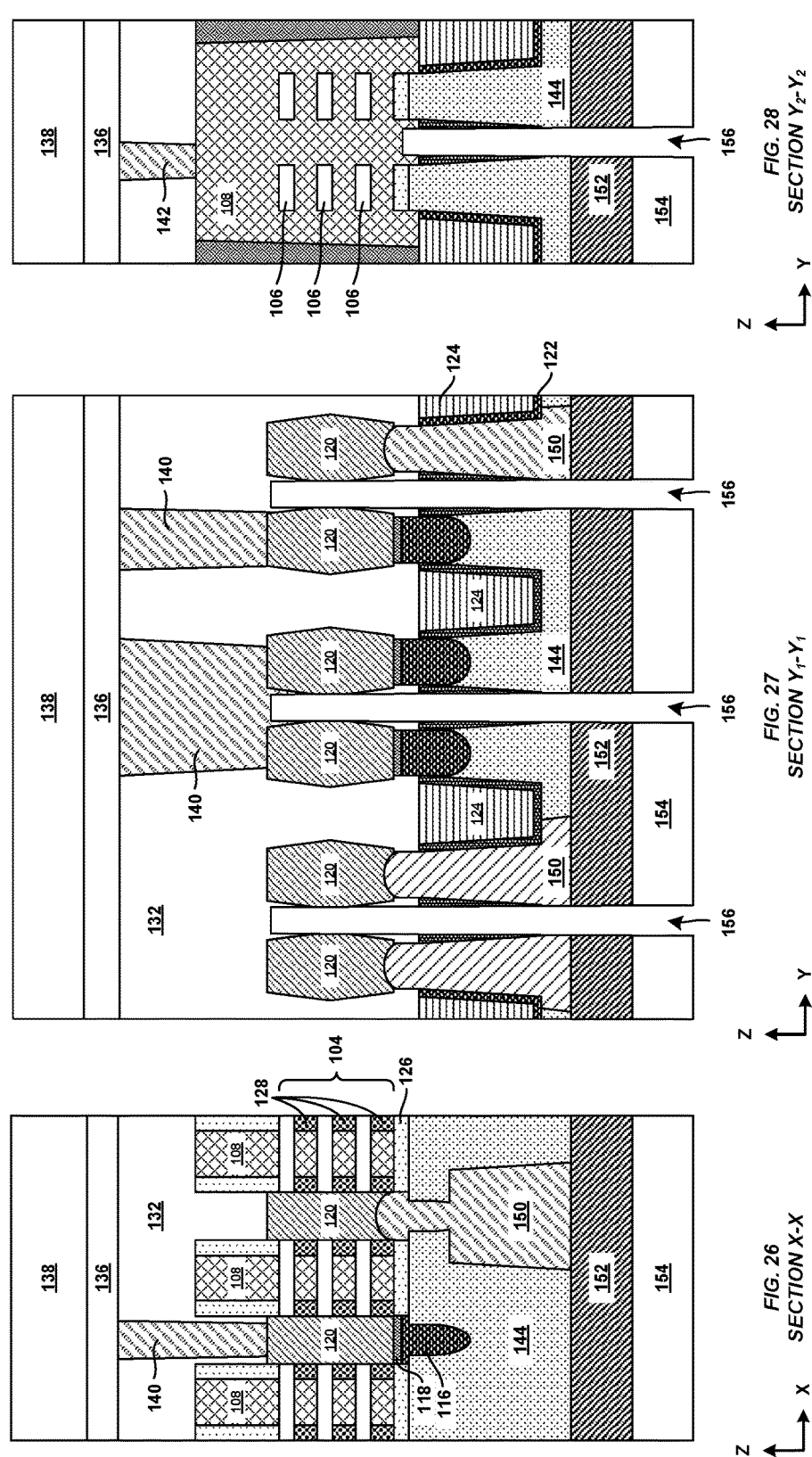
FIGS. 26, 27, and 28 are cross-sectional views of the semiconductor structure after backside cut trenches according to an exemplary embodiment.

Referring now to FIGS. 26, 27, and 28, the structure 100 is shown after forming backside cut trenches 156 according to an embodiment of the invention. FIG. 26 depicts a cross-sectional view of the structure 100 shown in FIG. 27 taken along line X-X, FIG. 27 depicts a cross-sectional view of the structure 100 shown in FIG. 26 taken along line $Y_1$-$Y_1$, and FIG. 28 depicts a cross-sectional view of the structure 100 taken along line $Y_2$-$Y_2$.

The pattern created by the second mask 154 is transferred into the structure 100 to form the backside cut trenches 156 according to known techniques. Specifically, portions of the backside metallization layer 152, the backside dielectric layer 144, the STI regions, the dielectric layer 132, the source drain contacts 140, and the gates 108 are etched or removed selective to the second mask 154, as illustrated. The portions of the structure 100 can be removed using a directional etching technique, such as, for example, reactive ion etching. Etching continues until the metal or the conductive material of both the source drain contacts 140 and the gates 108 are exposed.

As such, according to an embodiment, portions of the backside cut trenches 156 generally located in source drain regions of the structure 100 (see FIG. 27) will be deeper than portions of the backside cut trenches 156 generally located in gate regions of the structure 100 (see FIG. 28). According to an embodiment, the backside cut trenches 156 traverse in the x-direction across at least one source drain region and at least one gate region of the structure 100. In such embodiments, portions of the backside cut trenches 156 generally located in source drain regions will be deeper than portions of the same trench (156) generally located in gate regions of the structure 100. Said differently, the same backside cut trench 156 can have varying depths.

The different trench depths are attributable to the positions of the source drain regions 120 relative to the gates 108. For example, the source drain regions 120 are positioned higher in the structure 100 than the gates 108. Therefore, etching the backside cut trenches 156 stops at the gates 108 before stopping at the source drain regions 120 due to the inherent etch selectivity of dielectrics as compared with metals.

In all cases, the backside cut trenches 156 cut through an entire thickness of the backside metallization layer 152, and generally define individual backside power rails. In some embodiments, the backside cut trenches 156 will also divide otherwise merged contact structures in regions with small N2P spacing, as best illustrated at the left of FIG. 27.

Figures 29, 30, 31:
FIGS. 29, 30, and 31 are cross-sectional views of the semiconductor structure after forming backside cut dielectrics and backside power delivery network layers according to an exemplary embodiment.
Figure 32:
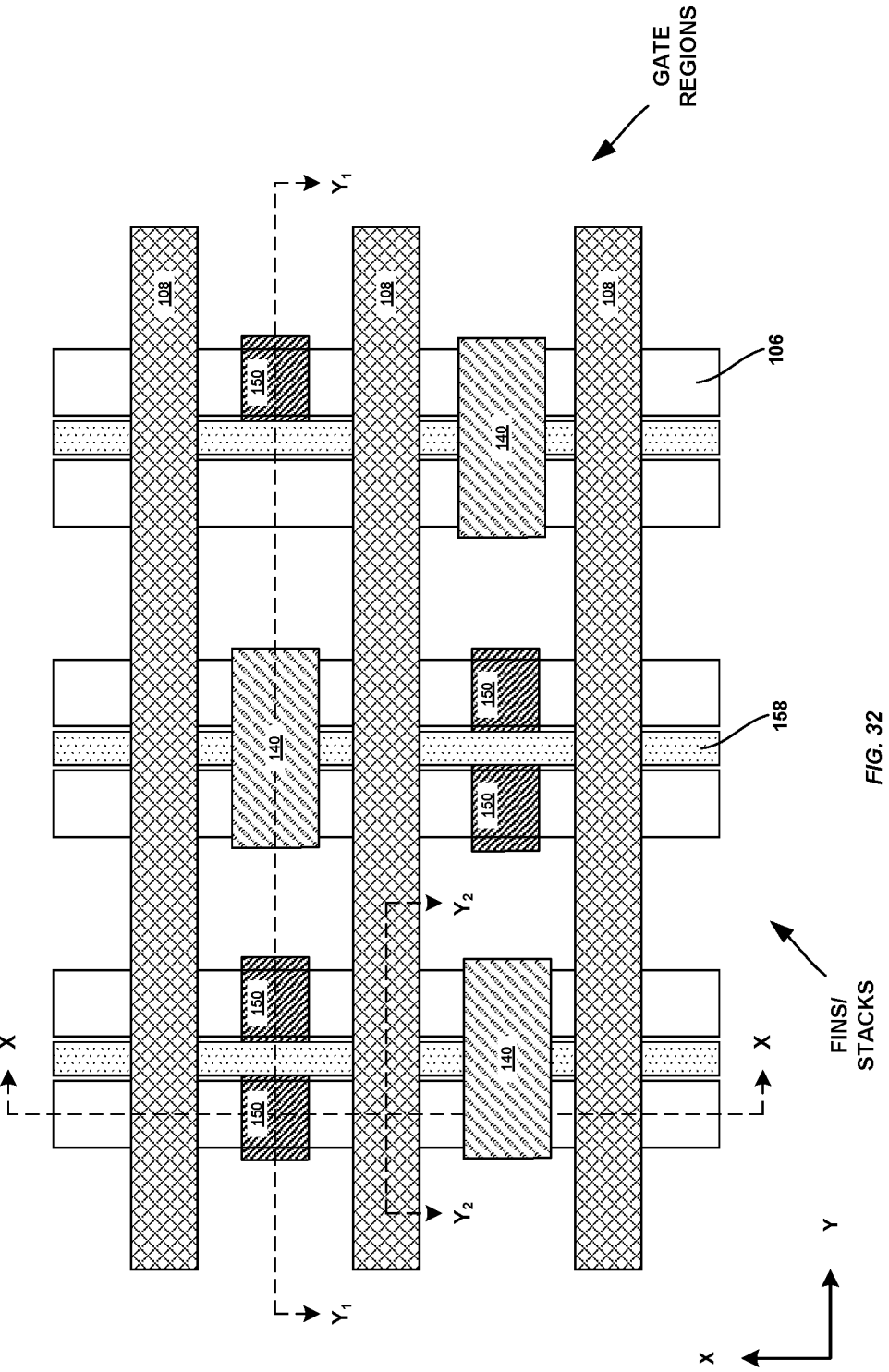
FIG. 32 is a top view of the semiconductor structure after forming backside cut dielectrics and backside power delivery network layers according to an exemplary embodiment.

Referring now to FIGS. 29, 30, 31 and 32, the structure 100 is shown after forming backside cut dielectrics 158 and backside power delivery network layers 160 according to an embodiment of the invention. FIG. 29 depicts a cross-sectional view of the structure 100 shown in FIG. 30 taken along line X-X, FIG. 30 depicts a cross-sectional view of the structure 100 shown in FIG. 29 taken along line Y$_1$-Y$_1$, and FIG. 31 depicts a cross-sectional view of the structure 100 taken along line Y$_2$-Y$_2$. FIG. 32 is a representative illustration of a top view of the structure 100 omitting some materials and layers, for example, patterning layers, masking layers and interlevel dielectrics. As such, only pertinent conductive layers and dielectric components are shown to provide a clear understanding of their relative orientation.

First, the second mask 154 is removed according to known techniques. Next, the backside cut trenches 156 are backfilled with a dielectric fill material thereby forming the backside cut dielectrics 158. Specifically, the dielectric fill material is blanket deposited across the structure 100 including within the backside cut trenches 156. After deposition, known chemical mechanical polishing may be used to remove excess portions of the dielectric fill material from top surfaces of the structure 100. After polishing, bottommost surfaces of the backside cut dielectrics 158 will be flush, or substantially flush with bottommost surfaces of the backside metallization layer 152, as illustrated.

Like described above with respect to the backside cut trenches 156, the backside cut dielectrics 158, according to an embodiment, portions of the backside cut dielectrics 158 generally located in source drain regions of the structure 100 (see FIG. 30) will be taller than the backside cut dielectrics 158 generally located in gate regions of the structure 100 (see FIG. 31). According to an embodiment, the backside cut dielectrics 158 traverse in the x-direction across at least one source drain region and at least one gate region of the structure 100. In such embodiments, portions of the backside cut dielectrics 158 generally located in source drain regions will be taller than portions of the same cut dielectric trench (158) generally located in gate regions of the structure 100. Said differently, the same backside cut dielectrics 158 can have varying heights.

After forming the backside cut dielectrics 158, the backside power delivery network layers 160 are subsequently formed according to known techniques.

With continued reference to FIGS. 29-32, and according to an embodiment, the structure 100 includes a backside cut dielectric physically separating two adjacent backside power rails, where a first portion of the backside cut dielectric contacts a source drain contact and a second portion of the backside cut dielectric contacts a gate.

With continued reference to FIGS. 29-32, and according to an embodiment, the backside cut dielectric physically bifurcates a backside source drain contact.

With continued reference to FIGS. 29-32, and according to an embodiment, the backside cut dielectric directly contacts and physically separates adjacent source drain regions.

With continued reference to FIGS. 29-32, and according to an embodiment, the first portion of the backside cut dielectric is taller than the second portion of the backside cut dielectric.

With continued reference to FIGS. 29-32, and according to an embodiment, a bottommost surface of the backside cut dielectric is substantially flush with a bottommost surface of the backside power rails.

With continued reference to FIGS. 29-32, and according to an embodiment, a topmost surface of the backside cut dielectric is above a bottom surface of a source drain contact.

With continued reference to FIGS. 29-32, and according to an embodiment, a bottommost surface of the gate is below a top surface of the backside cut dielectric.

With continued reference to FIGS. 29-32, and according to an embodiment, the structure 100 includes a backside cut dielectric physically separating an NFET source drain region from a PFET source drain region, where a first portion of the backside cut dielectric contacts a source drain contact and a second portion of the backside cut dielectric contacts a gate.

With continued reference to FIGS. 29-32, and according to an embodiment, the structure 100 includes backside cut dielectric physically separating an NFET source drain region from a PFET source drain region, where a first portion of the backside cut dielectric contacts a source drain contact and a second portion of the backside cut dielectric contacts a gate.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

What is claimed is:

1. A nanosheet semiconductor structure comprising:
a backside cut dielectric physically separating two adjacent backside power rails, wherein substantially linear sidewalls of the backside cut dielectric contact the two adjacent backside power rails, a source drain contact, and a gate.

2. The semiconductor structure according to claim 1, wherein the backside cut dielectric physically bifurcates a backside source drain contact.

3. The semiconductor structure according to claim 1, wherein the backside cut dielectric directly contacts and physically separates adjacent source drain regions.

4. The semiconductor structure according to claim 1, wherein a first portion of the backside cut dielectric is taller than a second portion of the backside cut dielectric.

5. The semiconductor structure according to claim 1, wherein a bottommost surface of the backside cut dielectric is substantially flush with bottommost surfaces of the two adjacent backside power rails.

6. The semiconductor structure according to claim 1, wherein a topmost surface of the backside cut dielectric is above a bottom surface of a source drain contact.

7. The semiconductor structure according to claim 1, wherein a bottommost surface of the gate is below a top surface of the backside cut dielectric.

8. A nanosheet semiconductor structure comprising:
a backside cut dielectric physically separating an NFET source drain region from a PFET source drain region, wherein substantially linear sidewalls of the backside cut dielectric contact two adjacent backside power rails, a source drain contact, and a gate.

9. The semiconductor structure according to claim 8, wherein the backside cut dielectric physically bifurcates a backside source drain contact.

10. The semiconductor structure according to claim 8, wherein the backside cut dielectric directly contacts and physically separates adjacent source drain regions.

11. The semiconductor structure according to claim 8, wherein a first portion of the backside cut dielectric is taller than a second portion of the backside cut dielectric.

12. The semiconductor structure according to claim 8, wherein a bottommost surface of the backside cut dielectric is substantially flush with bottommost surfaces of the two adjacent backside power rails.

13. The semiconductor structure according to claim 8, wherein a topmost surface of the backside cut dielectric is above a bottom surface of a source drain contact.

14. The semiconductor structure according to claim 8, wherein a bottommost surface of the gate is below a top surface of the backside cut dielectric.

15. A nanosheet semiconductor structure comprising:
a backside cut dielectric physically separating two adjacent backside power rails, wherein substantially linear sidewalls of the backside cut dielectric contact the two adjacent backside power rails, a source drain contact, and a gate, and wherein a first top surface of the backside cut dielectric contacts a bottom surface of the source drain contact and a second top surface of the backside cut dielectric contacts a bottom surface of the gate.

16. The semiconductor structure according to claim 15, wherein the backside cut dielectric physically bifurcates a backside source drain contact.

17. The semiconductor structure according to claim 15, wherein the backside cut dielectric directly contacts and physically separates adjacent source drain regions.

18. The semiconductor structure according to claim 15, wherein a height of the first top surface of the backside cut dielectric measured from a bottom surface of the backside cut dielectric is larger than a height of the second top surface of the backside cut dielectric measured from the bottom surface of the backside cut dielectric.

19. The semiconductor structure according to claim 15, wherein a bottommost surface of the backside cut dielectric is substantially flush with bottommost surfaces of the two adjacent backside power rails.

20. The semiconductor structure according to claim 15, wherein a topmost surface of the backside cut dielectric is above a bottom surface of a source drain contact, and wherein a bottommost surface of the gate is below a top surface of the backside cut dielectric.

\* \* \* \* \*